United States Patent
Cai et al.

(10) Patent No.: US 9,349,840 B2
(45) Date of Patent: May 24, 2016

(54) METHODS OF FORMING STRESSED CHANNEL REGIONS FOR A FINFET SEMICONDUCTOR DEVICE AND THE RESULTING DEVICE

(71) Applicants: GLOBALFOUNDRIES Inc., Grand Cayman (KY); International Business Machines Corporation, Armonk, NY (US)

(72) Inventors: Xiuyu Cai, Niskayuna, NY (US); Ruilong Xie, Niskayuna, NY (US); Ajey P. Jacob, Watervliet, NY (US); Witold P. Maszara, Morgan Hill, CA (US); Kangguo Cheng, Schenecdtady, NY (US); Ali Khakifirooz, Mountain View, CA (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/883,049

(22) Filed: Oct. 14, 2015

(65) Prior Publication Data
US 2016/0035863 A1 Feb. 4, 2016

Related U.S. Application Data

(62) Division of application No. 14/200,952, filed on Mar. 7, 2014.

(51) Int. Cl.
| | | |
|---|---|---|
| H01L 21/336 | (2006.01) | |
| H01L 29/66 | (2006.01) | |
| H01L 29/78 | (2006.01) | |
| H01L 21/762 | (2006.01) | |
| H01L 21/02 | (2006.01) | |
| H01L 29/165 | (2006.01) | |

(52) U.S. Cl.
CPC .... *H01L 29/66795* (2013.01); *H01L 21/02381* (2013.01); *H01L 21/02532* (2013.01); *H01L 21/76224* (2013.01); *H01L 29/165* (2013.01); *H01L 29/66545* (2013.01); *H01L 29/7849* (2013.01)

(58) Field of Classification Search
None
See application file for complete search history.

(56) References Cited

U.S. PATENT DOCUMENTS

| | | | |
|---|---|---|---|
| 8,513,125 B2 | 8/2013 | Saracco et al. | |
| 8,765,533 B2 | 7/2014 | Hsieh et al. | |
| 2006/0046399 A1 | 3/2006 | Lindert et al. | |
| 2012/0086053 A1 | 4/2012 | Tseng et al. | |
| 2012/0299099 A1 | 11/2012 | Huang et al. | |
| 2013/0341704 A1 | 12/2013 | Rachmady et al. | |
| 2014/0001520 A1* | 1/2014 | Glass | H01L 29/66439 257/288 |
| 2014/0091360 A1* | 4/2014 | Pillarisetty | H01L 21/8258 257/190 |
| 2014/0131660 A1 | 5/2014 | Cea et al. | |
| 2014/0197410 A1 | 7/2014 | Yin et al. | |
| 2014/0273423 A1 | 9/2014 | Fronheiser et al. | |

* cited by examiner

*Primary Examiner* — Ali Naraghi
(74) *Attorney, Agent, or Firm* — Amerson Law Firm, PLLC

(57) ABSTRACT

An illustrative method includes forming a FinFET device above structure comprising a semiconductor substrate, a first epi semiconductor material and a second epi semiconductor material that includes forming an initial fin structure that comprises portions of the semiconductor substrate, the first epi material and the second epi material, recessing a layer of insulating material such that a portion, but not all, of the second epi material portion of the initial fin structure is exposed so as to define a final fin structure, forming a gate structure above and around the final fin structure, removing the first epi material of the initial fin structure and thereby define an under-fin cavity under the final fin structure and substantially filling the under-fin cavity with a stressed material.

12 Claims, 12 Drawing Sheets

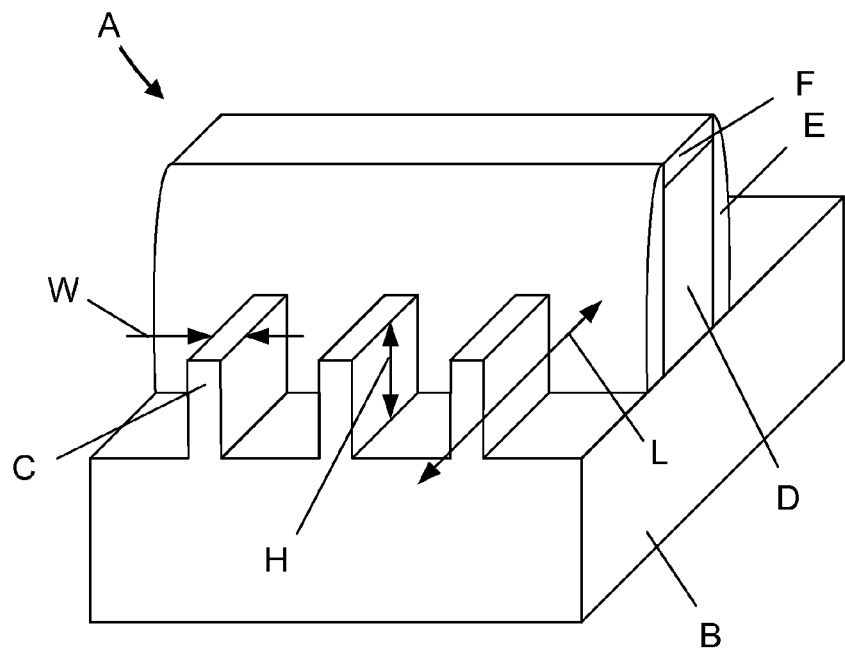
Figure 1A (Prior Art)
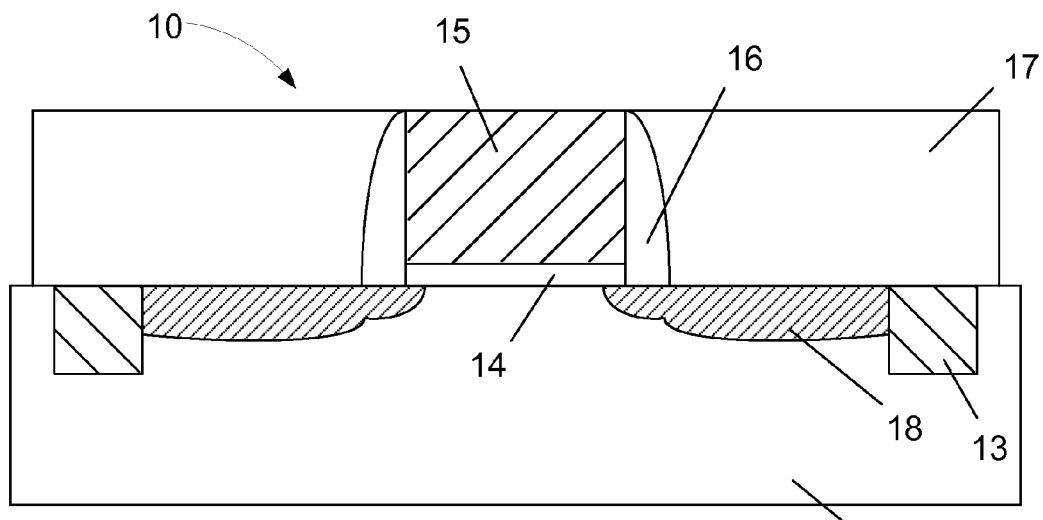
(Prior Art) Figure 1B

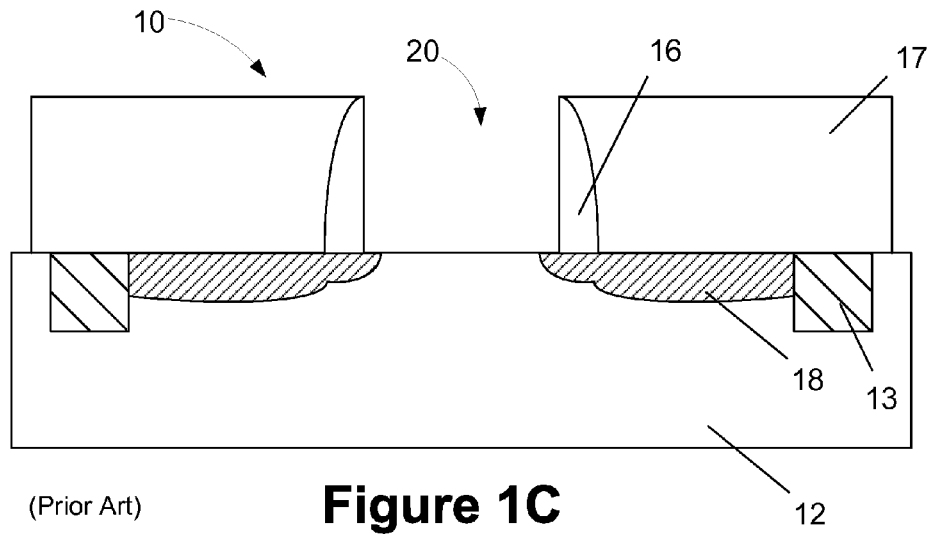
(Prior Art) Figure 1C
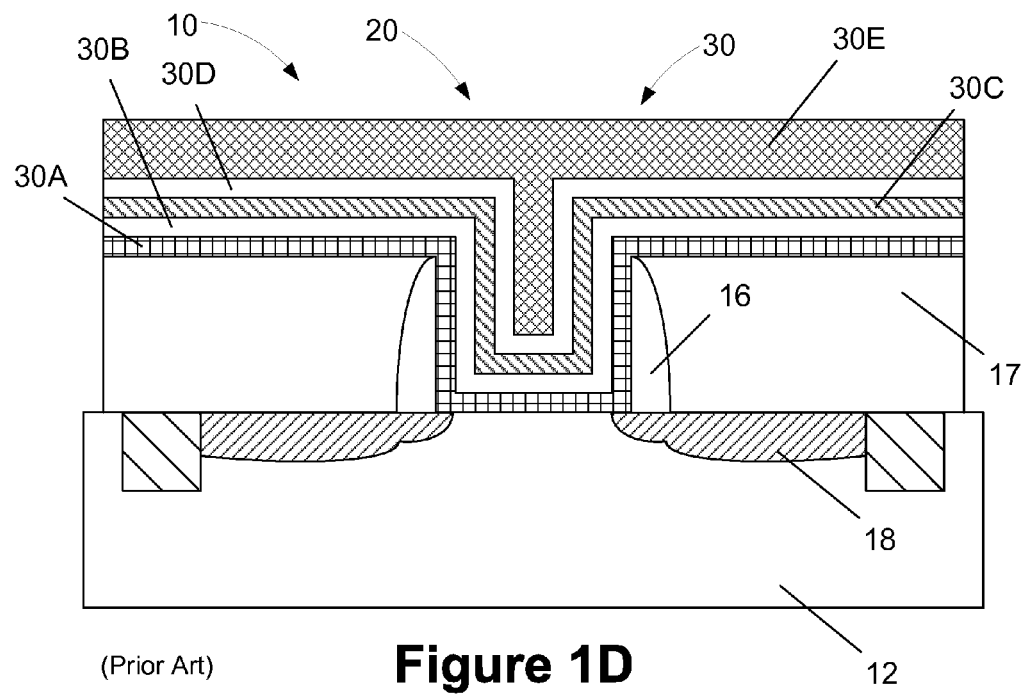
(Prior Art) Figure 1D

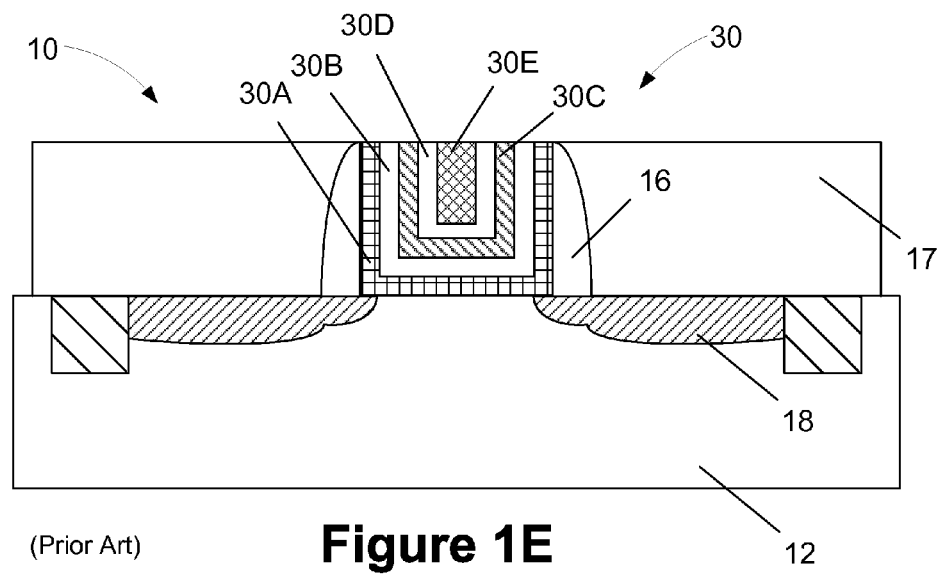
(Prior Art) Figure 1E
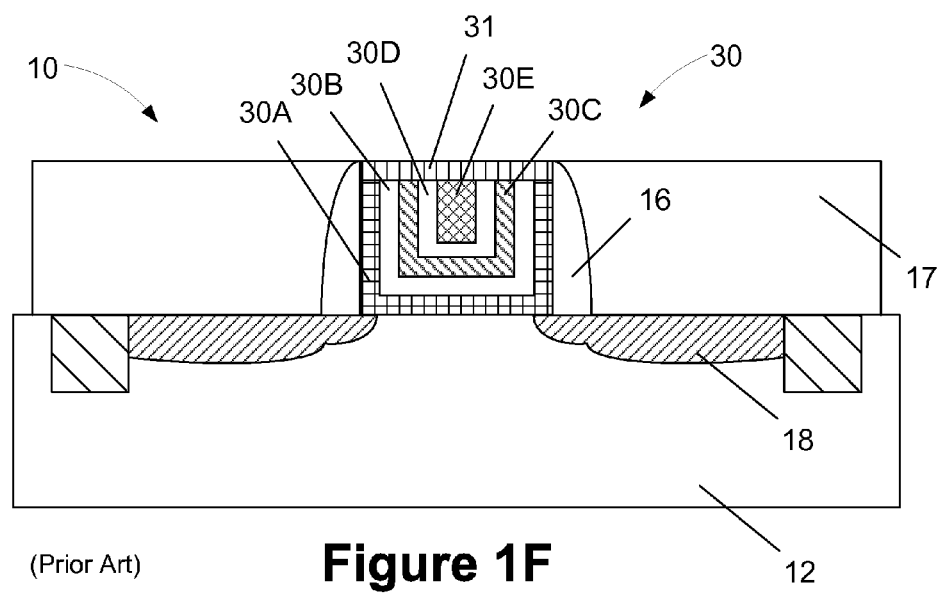
(Prior Art) Figure 1F

METHODS OF FORMING STRESSED CHANNEL REGIONS FOR A FINFET SEMICONDUCTOR DEVICE AND THE RESULTING DEVICE

BACKGROUND OF THE INVENTION

1. Field of the Invention

The present disclosure generally relates to the fabrication of integrated circuits, and, more particularly, to various methods of forming a stressed channel region for a FinFET semiconductor device and the resulting semiconductor device.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as FinFET devices.

A field effect transistor (FET), irrespective of whether an NMOS transistor or a PMOS transistor is considered, and irrespective of whether it is a planar or 3D FinFET device, typically comprises doped source/drain regions that are formed in a semiconductor substrate that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epi semiconductor material in recesses formed in the source/drain regions of the planar FET device. In some cases, the epi material may be formed in the source/drain regions without forming any recesses in the substrate for a planar FET device. The gate structures for such planar FET devices may be manufactured using so-called "gate-first" or "replacement gate" (gate-last) manufacturing techniques.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap F. The gate structure D is typically comprised of a layer of insulating material (not separately shown), e.g., a layer of high-k insulating material or silicon dioxide, and one or more conductive material layers (e.g., metal and/or poly-silicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D is the channel region of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source/drain regions. Even if an epi "merger" process is not performed, an epi growth process will typically be performed on the fins C to increase their physical size. In the FinFET device A, the gate structure D may enclose both sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). The gate structures D for such FinFET devices may be manufactured using so-called "gate-first" or "replacement gate" (gate-last) manufacturing techniques.

Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2×) the vertical fin-height plus the width of the top surface of the fin, i.e., the fin width (for a tri-gate device). Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

For many early device technology generations, the gate structures of most transistor elements (planar or FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate-last" or "replacement gate" technique. The replacement gate process may be used when forming planar devices or 3D devices. FIGS. 1B-1F simplistically depict one illustrative prior art method for forming an HK/MG replacement gate structure using a replacement gate technique on a planar transistor device. As shown in FIG. 1B, the process includes the formation of a basic transistor structure above a semiconductor substrate 12 in an active area defined by a shallow trench isolation structure 13. At the point of fabrication depicted in FIG. 1B, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1B, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1C, one or more etching processes are performed to remove the sacrificial gate electrode 15 and the sacrificial gate insulation layer 14 to thereby define a gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications. Even in cases where the sacrificial gate insulation layer 14 is intentionally removed, there will typically be a very thin native oxide layer (not shown) that forms on the substrate 12 within the gate cavity 20.

Next, as shown in FIG. 1D, various layers of material that will constitute a replacement gate structure 30 are formed in the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten.

Ultimately, as shown in FIG. 1E, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

FIG. 1F depicts the device 10 after several process operations were performed. First, one or more recess etching processes were performed to remove upper portions of the various materials within the cavity 20 so as to form a recess within the gate cavity 20. Then, a gate cap layer 31 was formed in the recess above the recessed gate materials. The gate cap layer 31 is typically comprised of silicon nitride and it may be formed by depositing a layer of gate cap material so as to over-fill the recess formed in the gate cavity and thereafter performing a CMP process to remove excess portions of the gate cap material layer positioned above the surface of the layer of insulating material 17. The gate cap layer 31 is formed so as to protect the underlying gate materials during subsequent processing operations.

Device designers are under constant pressure to increase the operating speed and electrical performance of transistors and integrated circuit products that employ such transistors. Given that the gate length (the distance between the source and drain regions) on modern transistor devices may be approximately 20-50 nm, and that further scaling is anticipated in the future, device designers have employed a variety of techniques in an effort to improve device performance, e.g., the use of high-k dielectrics, the use of metal gate electrode structures, the incorporation of work function metals in the gate electrode structure and the use of channel stress engineering techniques on transistors (create a tensile stress in the channel region for NMOS transistors and create a compressive stress in the channel region for PMOS transistors). Stress engineering techniques typically involve the formation of specifically made silicon nitride layers that are selectively formed above appropriate transistors, i.e., a layer of silicon nitride that is intended to impart a tensile stress in the channel region of a NMOS transistor would only be formed above the NMOS transistors. Such selective formation may be accomplished by masking the PMOS transistors and then blanket depositing the layer of silicon nitride, or by initially blanket depositing the layer of silicon nitride across the entire substrate and then performing an etching process to selectively remove the silicon nitride from above the PMOS transistors. Conversely, for PMOS transistors, a layer of silicon nitride that is intended to impart a compressive stress in the channel region of a PMOS transistor is formed above the PMOS transistors. The techniques employed in forming such nitride layers with the desired tensile or compressive stress are well known to those skilled in the art.

As noted above, as the channel length of the transistors has decreased, the pitch between adjacent transistors likewise decreases, thereby limiting the area of space between the transistors. For example, current-day transistors may be fabricated with a channel length that ranges from 20-30 nm with a gate pitch that ranges from 50-70 nm. This results in spacing between the sidewall spacers on adjacent gate structures of about 10-20 nm. Formation of stress-inducing layers in such a small space is very difficult and it can lead to problems, such as the formation of voids, which may limit the effectiveness of such stress-inducing layers.

The present disclosure is directed to various methods of forming a stressed channel region for a FinFET semiconductor device and the resulting semiconductor device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a stressed channel region for a FinFET semiconductor device and the resulting semiconductor device. One illustrative method disclosed includes, among other things, forming a first epi semiconductor material on a semiconductor substrate, forming a second epi semiconductor material on the first epi semiconductor material, performing at least one trench etching process to define a plurality of trenches in the substrate so as to thereby define an initial fin structure comprised of a portion of the substrate, a portion of the first epi semiconductor material and a portion of the second epi semiconductor material, wherein the initial fin structure has an axial length, and forming a layer of insulating material so as to over-fill the trenches. In this example, the method further includes the steps of, with the layer of insulating material over-filling the trenches, performing a heating process to form a nanowire structure that is positioned between and spaced apart from the second epi semiconductor material portion and the substrate portion of the initial fin structure, wherein the nanowire structure extends for the entire axial length of the initial fin structure and wherein the second epi semiconductor material constitutes the final fin structure of the device, after forming the nanowire structure, performing a first recess etching process to recess an upper surface of the layer of insulating material such that a portion, but not all, of the final fin structure is exposed, forming a gate structure above and around the exposed portion of the final fin structure, after forming the gate structure, performing a second recess etching process to further recess the previously recessed upper surface of the layer of insulating material such that the nanowire structure is exposed, with the gate structure remaining in position, performing at least one nanowire etching process to remove the nanowire structure and thereby define an under-fin cavity under the final fin structure, and substantially filling the under-fin cavity with a stressed material Another illustrative method disclosed herein includes, among other things, forming a first epi semiconductor material on a semiconductor substrate, forming a second epi semiconductor material on the first epi semiconductor material, performing at least one trench etching process to define a plurality of trenches in the substrate so as to thereby define an initial fin structure comprised of a portion of the substrate, a portion of the first epi semiconductor material and a portion of the second epi semiconductor material, wherein the initial fin structure has an axial length, and forming a layer of insulating material so as to over-fill the trenches. In this example, the method further includes the steps of performing a first recess etching process to recess an upper surface of the layer of insulating material such that a portion, but not all, of the second epi semiconductor material portion of the initial fin structure is exposed, wherein the second epi semiconductor material constitutes the final fin structure of the device, forming a gate structure above and around the final fin structure, after forming the gate structure, performing a second recess etching process to further recess the previously recessed upper surface of the layer of insulating material such that the first epi semiconductor material of the initial fin structure is exposed, with the gate structure remaining in position, performing at least one etching process to remove the first epi semiconductor material of the initial fin structure and thereby define an under-fin cavity under the final fin structure, and substantially filling the under-fin cavity with a stressed material.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1F depict one illustrative prior art method of forming a gate structure of the transistors using a so-called "replacement gate" technique;

Figure 2A:
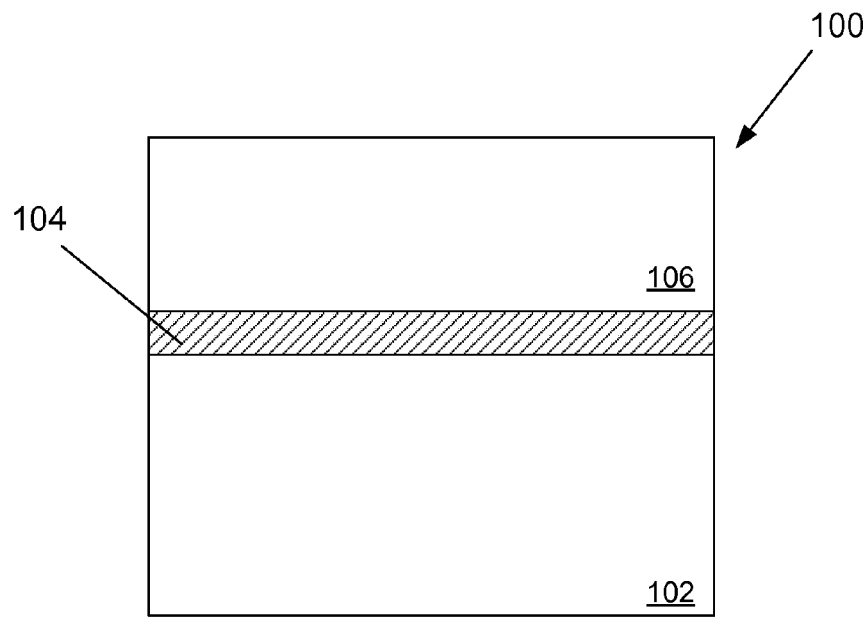
FIGS. 2A-2K depict various illustrative methods disclosed herein of forming a stressed channel region for a FinFET semiconductor device and the resulting semiconductor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a stressed channel region for a FinFET semiconductor device and the resulting semiconductor device. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs. For purposes of disclosure, reference will be made to an illustrative process flow wherein a single FinFET device 100 is formed. Moreover, the inventions will be disclosed in the context of forming the gate structures using a replacement gate ("gate-last") processing technique. Of course, the inventions disclosed herein should not be considered to be limited to the illustrative examples depicted and described herein. With reference to the attached figures, various illustrative embodiments of the methods and devices disclosed herein will now be described in more detail.

In one embodiment, the illustrative device 100 will be formed in and above the semiconductor substrate 102, having a bulk configuration. The device 100 may be either an NMOS or a PMOS transistor. Additionally, various doped regions, e.g., source/drain regions, halo implant regions, well regions and the like, are not depicted in the attached drawings. The substrate 102 may be made of silicon or it may be made of materials other than silicon. Thus, the terms "substrate" or "semiconductor substrate" should be understood to cover all semiconducting materials and all forms of such materials.

The attached drawings present various views of various embodiments of a FinFET device 100 that may be formed using the methods disclosed herein. Unless otherwise noted, the cross-sectional views are taken through the gate structure of the device in the gate-width direction of the device. The illustrative FinFET device 100 disclosed herein will be depicted as being comprised of two illustrative fins. However, as will be recognized by those skilled in the art after a complete reading of the present application, the methods and devices disclosed herein may be employed when manufacturing FinFET devices having any number of fins. The various layers of material depicted in following drawings may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIG. 2A depicts the device 100 at a point in fabrication wherein several process operations have been performed. First, a relatively thin layer of a first epi semiconductor material 104 was blanket deposited on the substrate 102. Next, a second epi semiconductor material 106 was deposited on the first epi semiconductor material 104. In general, in one embodiment, the first epi semiconductor material 104 may be a material that may be selectively removed (by etching) relative to the substrate 102 and the second epi semiconductor material 106. In one illustrative embodiment, the first epi semiconductor material 104 may have a thickness of about 5-10 nm and it may be comprised of silicon-germanium ($Si_xGe_{1-x}$), where the concentration of the germanium may also vary depending upon the particular application, e.g., $SiGe_{0.5}$. The second epi semiconductor material 106 and the substrate 102 may both be made of silicon. In one embodiment, the second epi semiconductor material 106 may have a thickness of about 30 nm, but the thickness may vary depending on the particular application. The first and second epi semiconductor materials 104, 106 may be made by performing a traditional epitaxial deposition process.

Figure 2B:
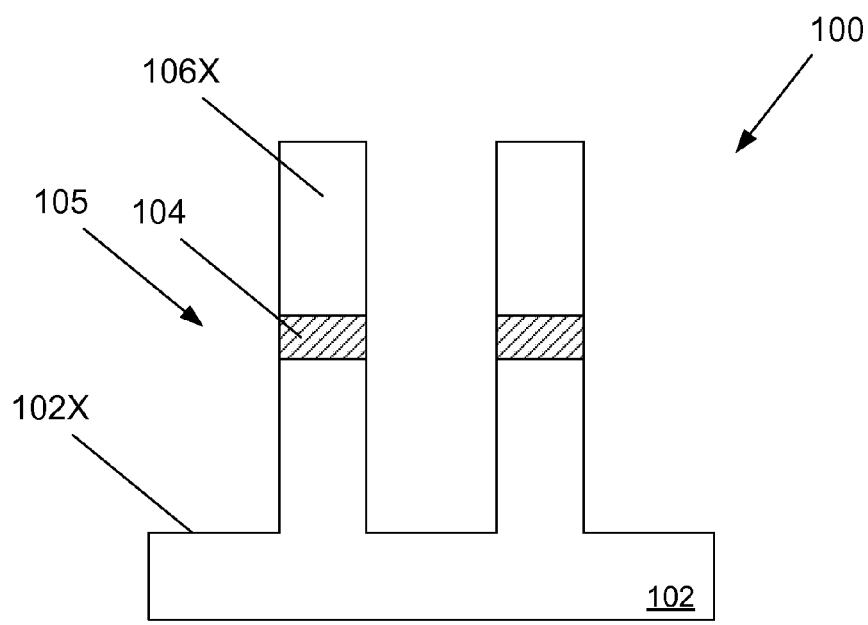

FIG. 2B depicts the device after one or more trench etching processes, e.g., anisotropic etching processes, were performed through a patterned masking layer (not shown) to define a plurality of trenches 102X in the substrate 102. The formation of the trenches 102X results in the formation of a plurality of initial fin structures 105 that are comprised of a portion of the substrate 102, a portion of the first epi semiconductor material 104 and a portion of the second epi semiconductor material 106X. As will be appreciated by those skilled in the art after a complete reading of the present application, the second epi semiconductor material 106X will become the final fin structure of the device and be referred to as such henceforth. As depicted, a portion of the first epi semiconductor material 104 is positioned under the final fin structure 106X and above the substrate portion of the initial fin structure 105. The width and height of the final fin structure 106X as well as the depth of the trenches 102X may vary depending upon the particular application. Additionally, the overall size, shape and configuration of the trenches 102X, the initial fin structures 105 and the final fin structures 106X may vary depending on the particular application. In the illustrative examples depicted in most of the attached drawings, the fin-formation trenches 102X, the initial fin structures 105 and the final fin structures 106X are all depicted as having a uniform size and shape. However, such uniformity in the size and shape of the fin-formation trenches 102X, the initial fin structures 105 and the final fin structures 106X is not required to practice at least some aspects of the inventions disclosed herein. In the attached figures, the fin-formation trenches 102X are depicted as having been formed by performing an anisotropic etching process that results in the fin-formation trenches 102X and the final fin structures 106X having a schematically depicted, generally rectangular configuration. In an actual real-world device, the sidewalls of the fin-formation trenches 102X may be somewhat inwardly tapered, although that configuration is not depicted in the attached drawings. In some cases, the fin-formation trenches 102X may have a reentrant profile (not shown) near the bottom of the fin-formation trenches 102X. To the extent the fin-formation trenches 102X are formed by performing a wet etching process, the fin-formation trenches 102X may tend to have a more rounded configuration or non-linear configuration as compared to the generally rectangular configuration of the fin-formation trenches 102X that are formed by performing an anisotropic etching process. Thus, the size and configuration of the fin-formation trenches 102X, and the manner in which they are made, as well as the general configuration of the final fin structures 106X, should not be considered a limitation of the present invention. For ease of disclosure, only the substantially rectangular fin-formation trenches 102X, initial fin structures 105 and final fin structures 106X will be depicted in the subsequent drawings.

Figure 2C:
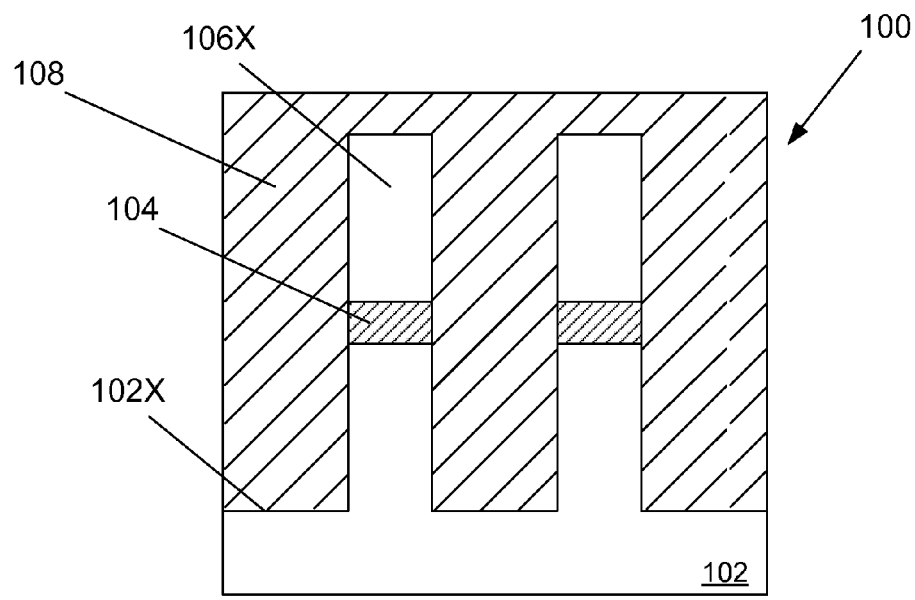

FIG. 2C depicts the device 100 after several process operations have been performed. First, a layer of material 108, such as a layer of insulating material, was blanket deposited across the device 100. The layer of material 108 may be comprised of a variety of different materials, such as silicon dioxide, etc., and it may be formed by performing a variety of techniques, e.g., chemical vapor deposition (CVD), etc. Thereafter, an optional chemical mechanical polishing (CMP) process was performed to planarize the upper surface of the layer of material 108.

Figure 2D:
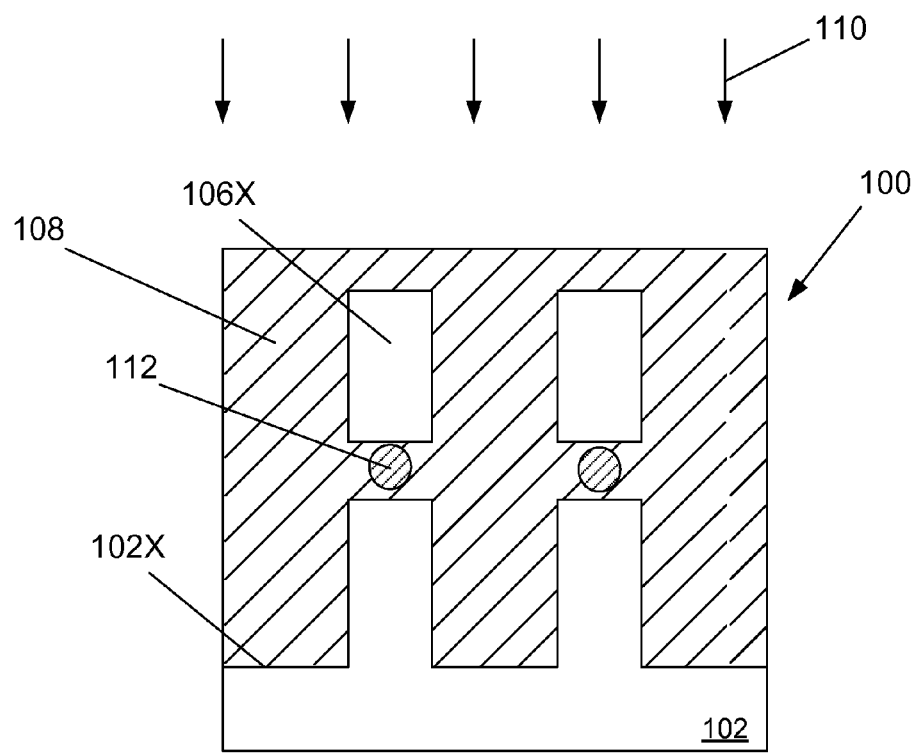

FIG. 2D depicts the device 100 after a heating process 110, i.e., a condensation/reflow process heating process, was performed on the device 100. In general, the heating process 110 causes oxidation of the first epi semiconductor material 104 and leads to condensation of germanium, thereby separating the first epi semiconductor material 104 from the substrate 102 and the final fin structure 106X. At the completion of the heating process 110, the illustrative nanowires 112 may have a substantially rod-like cross-sectional configuration, as depicted in FIG. 2D. The nanowires 112 are spaced apart from and positioned under the final fin structure 106X and spaced apart from and positioned above the substrate portion 102 of the initial fin structure. Additionally, the nanowires 112 extend under the final fin structure 106X for the entire axial length of the initial fin structures 105. Note that the rod-like configurations need not be a perfect geometric form, and all fins 106X subjected to the heating process 110 may not produce nanowires having the same cross-sectional configuration. In one illustrative embodiment, where the final fin structures 106X are made of silicon, the heating process 110 may be an oxygen or inert (e.g., $N_2$) anneal process performed in a chamber or a furnace at a temperature within the range of about 600-1100° C. for a duration of about 10-600 seconds and at a pressure that falls within the range of 0.1-600 Torr. In one embodiment, at the end of the heating process 110, the nanowires 112 are primarily condensed Ge and thus may be selectively etched relative to the final fin structures 106X and the substrate 102.

Figure 2E:
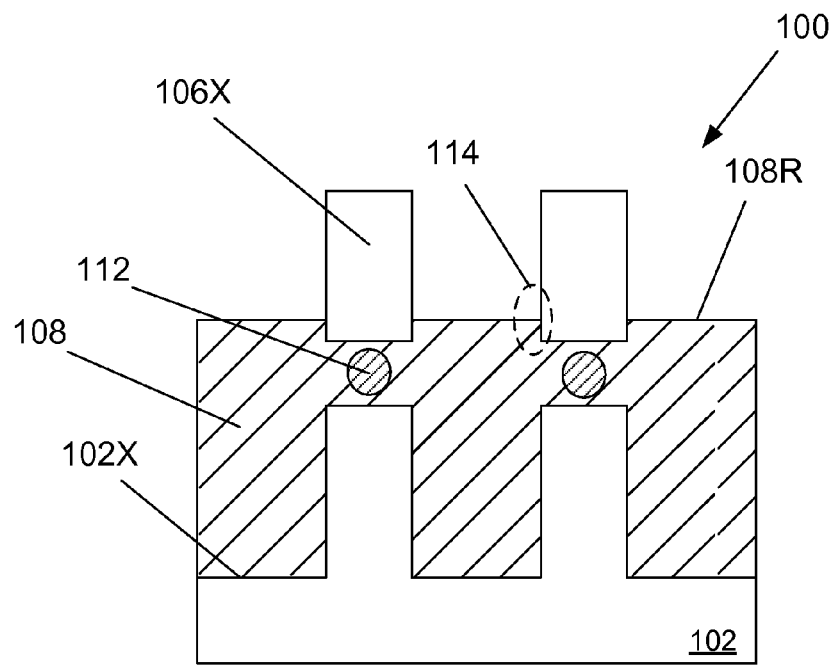

FIG. 2E depicts the device 100 after a first recess etching process was performed to recess the layer of insulating material 108 relative to the surrounding materials. In one embodiment, the first recess etching process may be an isotropic etching process. Note that this first recess etching process is controlled such that the recessed upper surface 108R of the layer of insulating material still covers a portion of the fins 106X, as indicated in the dashed-line region 114.

Figure 2F:
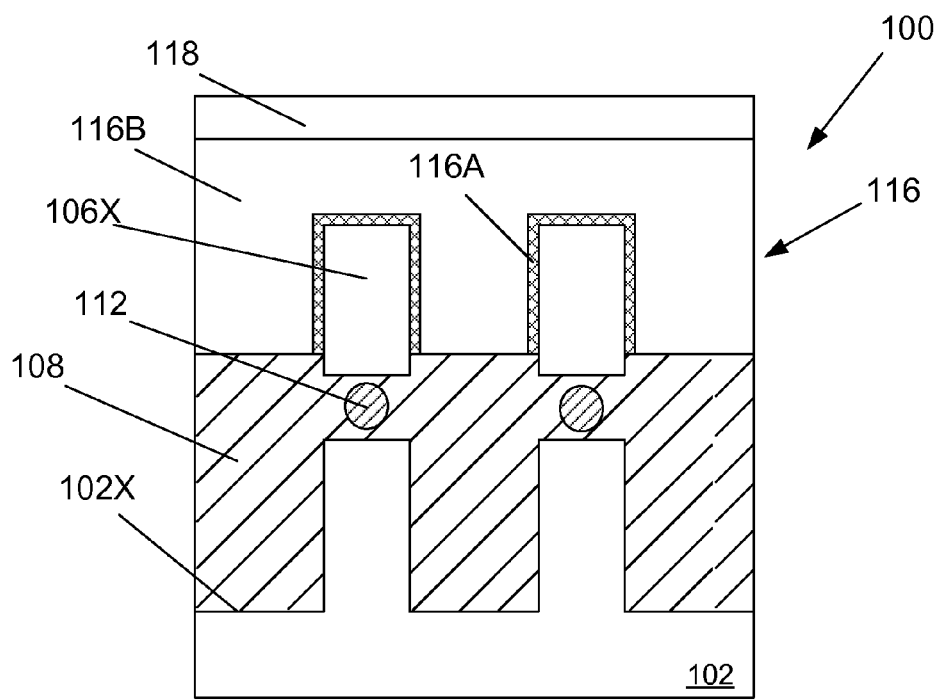

FIG. 2F depicts the device 100 after an illustrative gate structure 116 (e.g., a sacrificial gate structure), gate cap layer 118 and sidewall spacers 125 (not shown in FIG. 2F—see FIGS. 2J-2K) were formed on the device 100. In this example, the gate structure 116 includes a dummy or sacrificial gate insulating layer 116A comprised of, for example, silicon dioxide, and a sacrificial or dummy gate electrode 116B comprised of, for example, polysilicon or amorphous silicon. The gate cap layer 118 and the sidewall spacers 125 may be comprised of a material such as silicon nitride. The gate structure 116 and the gate cap layer 118 may be formed by depositing the appropriate layer of material on the device and thereafter patterning those materials using traditional photolithography and etching techniques. Then, the sidewall spacers 125 may be formed adjacent the gate structure 116. The spacers 125 may be formed by depositing a layer of spacer material and thereafter performing an anisotropic etching process.

Figure 2G:
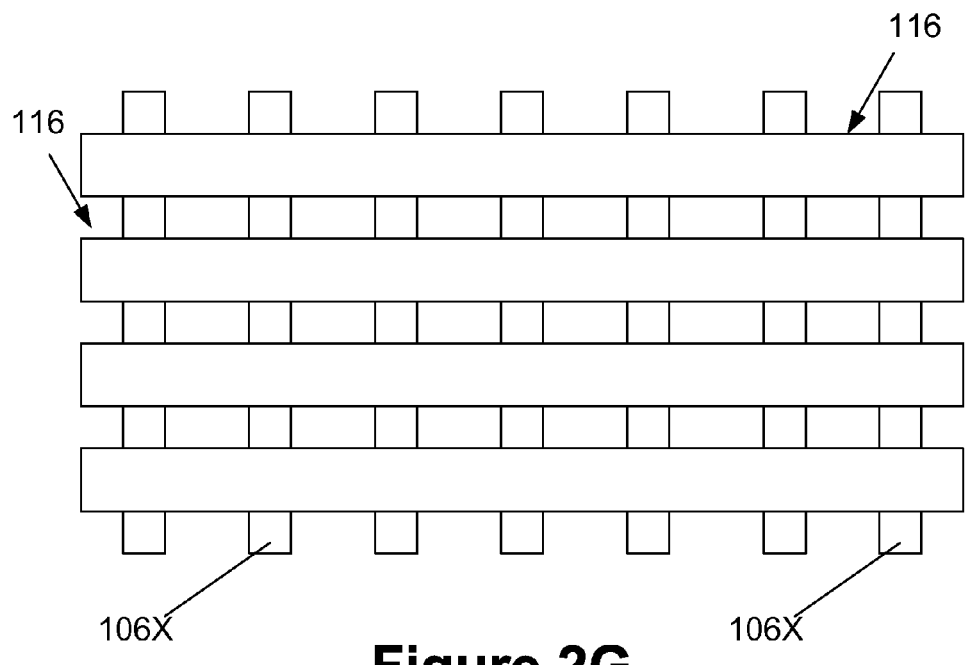

While FIG. 2F is a cross-sectional view that is focused on the formation of a single FinFET device 100 comprised of two final fin structures 106X, FIG. 2G is a plan view of a portion of the overall substrate 102. As depicted in FIG. 2G, at this point in the process flow, the final fin structures 106X (vertically oriented in FIG. 2G) and the gate structures 116 (horizontally oriented in FIG. 2G) are essentially a network of interconnected lines. Eventually, the gate structures 116 and the final fin structures 106X will be patterned to define the desired device, and isolation material will be added to electrically isolate the various devices from one another. The interconnected gate structures 116 will provide mechanical support to the final fin structures 106X at a later stage of processing, as described more fully below.

Figure 2H:
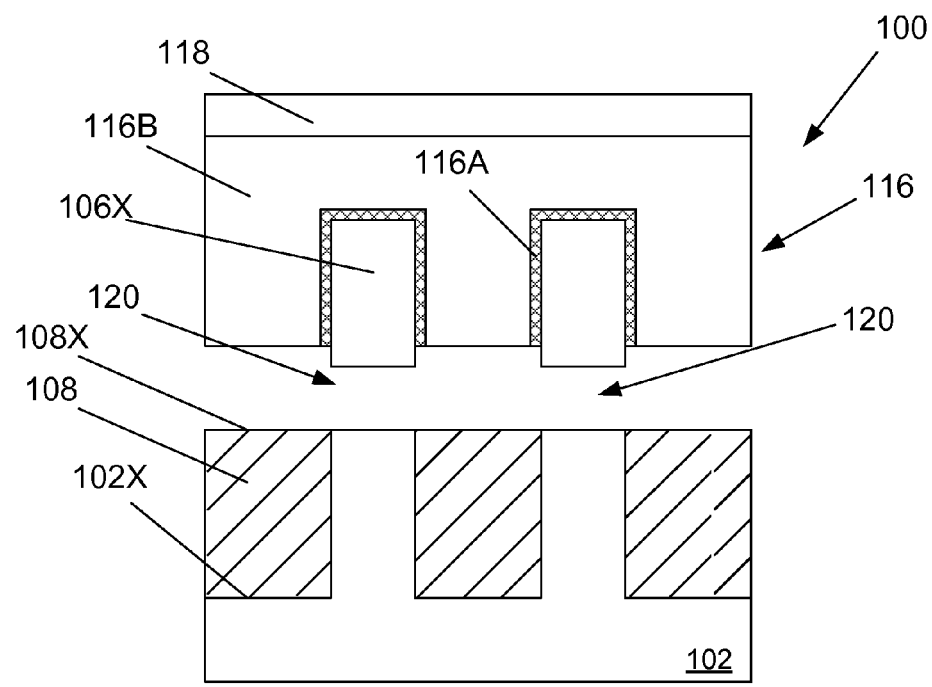

FIG. 2H depicts the device 100 after several process operations were performed.

First, a second recess etching process was performed to further recess the previously recessed layer of insulating material 108 relative to the surrounding materials. In one embodiment, the second recess etching process may be an isotropic etching process. Note that this second recess etching process is controlled such that the further recessed upper surface 108X of the layer of insulating material 108 fully exposes at least the nanowires 112 for further processing. After the second recess etching process was performed, an isotropic etching process was performed to remove the exposed nanowires 112 selectively relative to the final fin structure 106X and the substrate portion 102 of the initial fin structure 105. This results in the formation of an under-fin cavity 120 that extends under the entire axial length of each of the final fin structures 106X, i.e., under the channel region of the device and under the final fin structures 106X in the source/drain regions of the device. The interconnected gate structures 116 provide mechanical support to the final fin structures 106X after the under-fin cavity 120 is formed and before it is filled, as described more fully below.

Figure 2I:
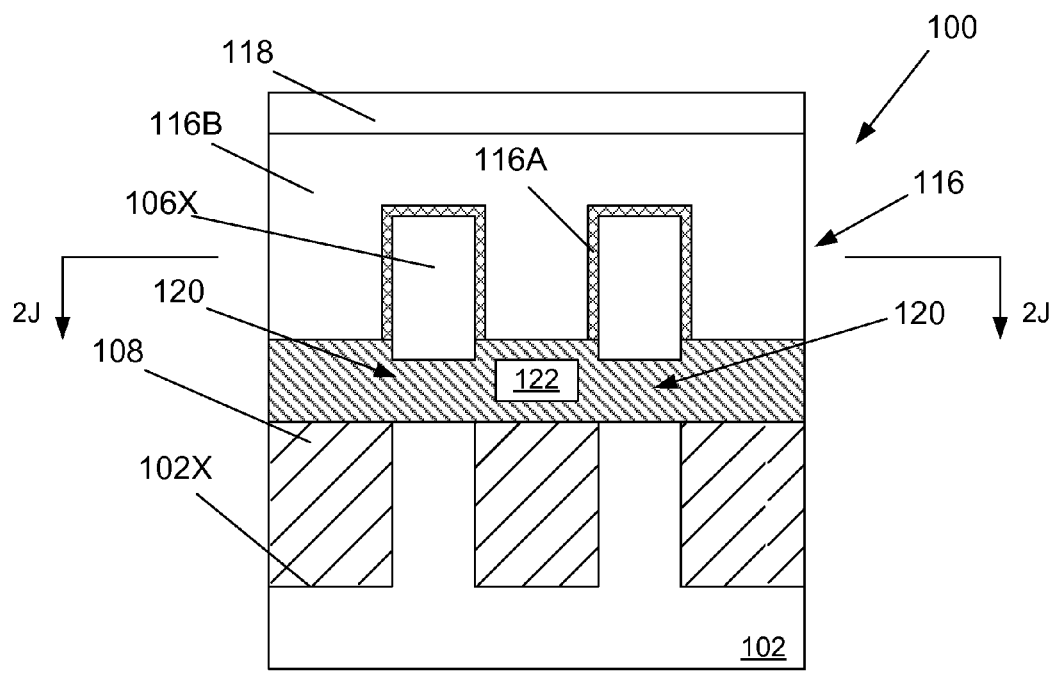
Figure 2J:
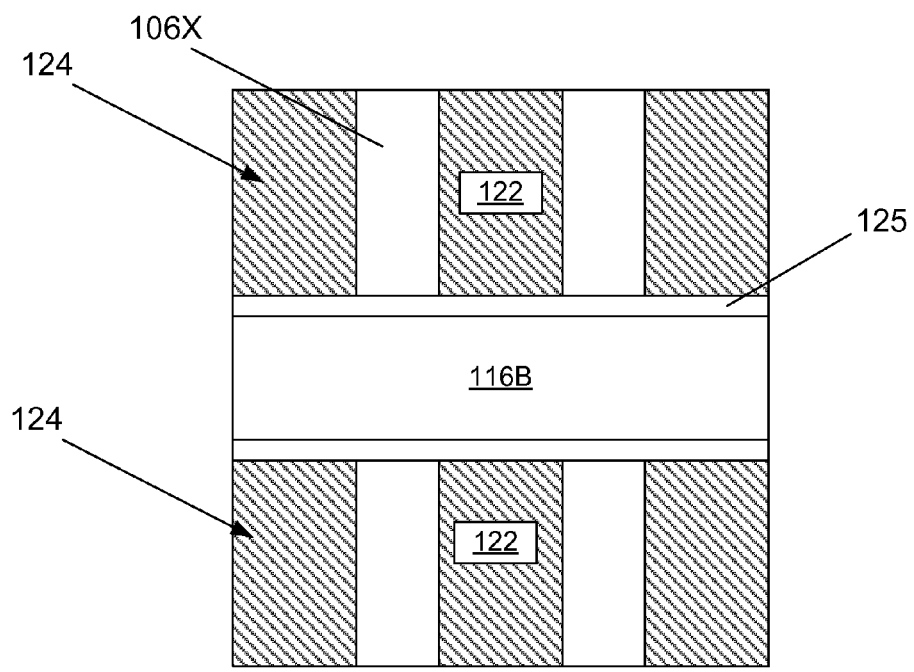
Figure 2K:
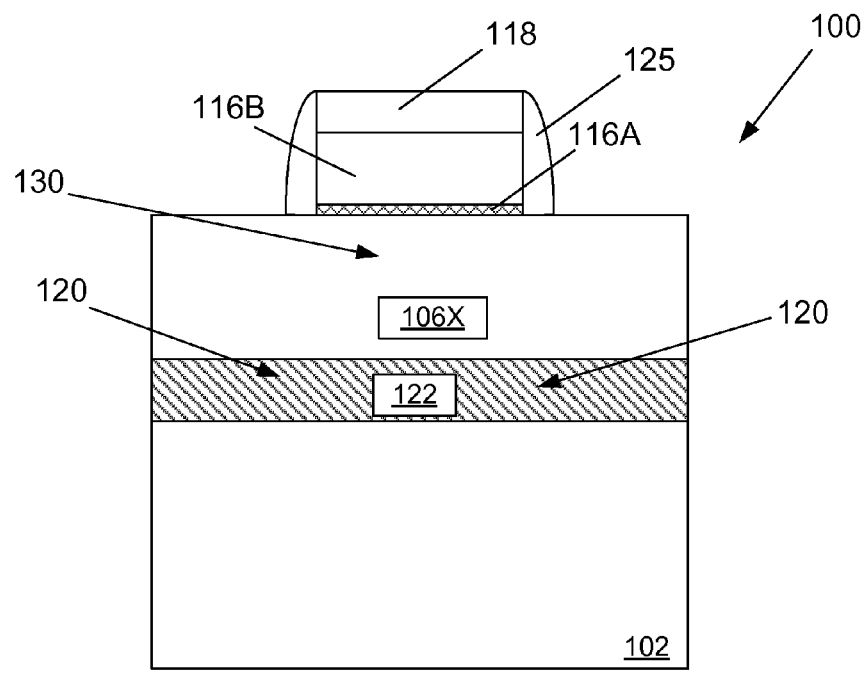

FIGS. 2I-2K depict the device 100 after the under-fin cavity 120 was substantially filled with a stressed material 122. As noted above, FIG. 2I is a cross-sectional view taken through the long axis of the gate structure 116, i.e., in the gate width direction of the device 100. FIG. 2J is a plan view taken where indicated in FIG. 2I. FIG. 2k is a cross-sectional view taken through the long axis of the final fin structures 106X, i.e., in the gate length (current transport) direction of the device 100. As can be seen in these figures, the stressed material 122 is formed under the entire axial length of the final fin structures 106X, under the channel region 130 (see FIG. 2K) and generally across what will become the source/drain regions 124 of the device 100. The stressed material 122 may be formed with either a tensile or compressive stress, depending upon the type of device (N or P) under construction, and it may be formed with any desired magnitude of stress, e.g., 0.6-3 GPa (tensile or compressive). In one illustrative example, the stressed material 122 may be a layer of a nitride material, an oxide material or a metal-containing material, such as silicon nitride, silicon dioxide or a metal oxide, and it may be formed by performing a traditional deposition process (e.g., ALD).

Figure 3A:
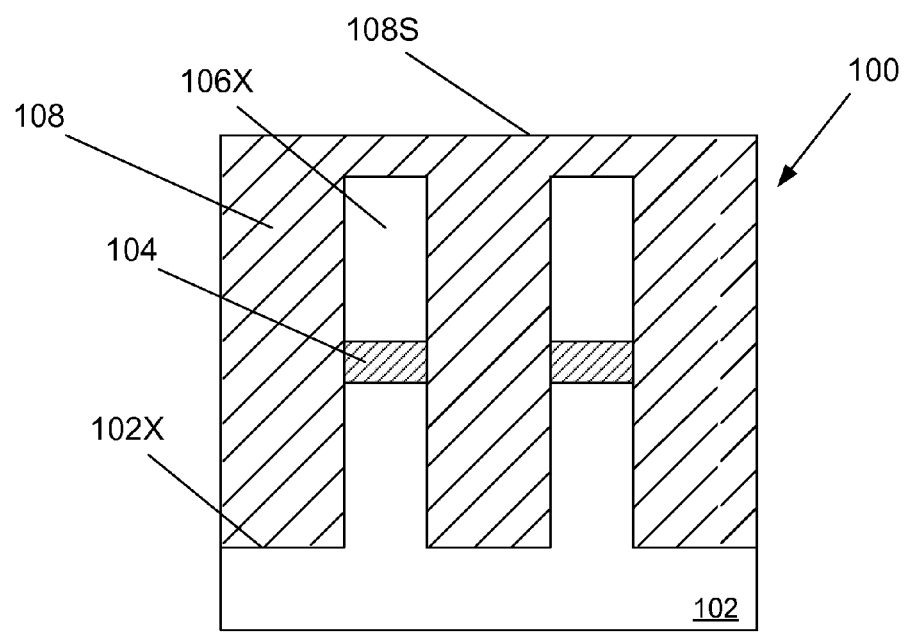
FIGS. 3A-3F depict yet other methods disclosed herein of forming a stressed channel region for a FinFET semiconductor device and the resulting semiconductor device.

FIGS. 3A-3F depict yet other methods disclosed herein of forming a stressed channel region for a FinFET semiconductor device and the resulting semiconductor device. FIG. 3A depicts the device at a point in the process flow that corresponds to that depicted in FIG. 2C, wherein, in this embodiment, a CMP process has been performed on the upper surface 108S of the layer of insulating material 108.

Figure 3B:
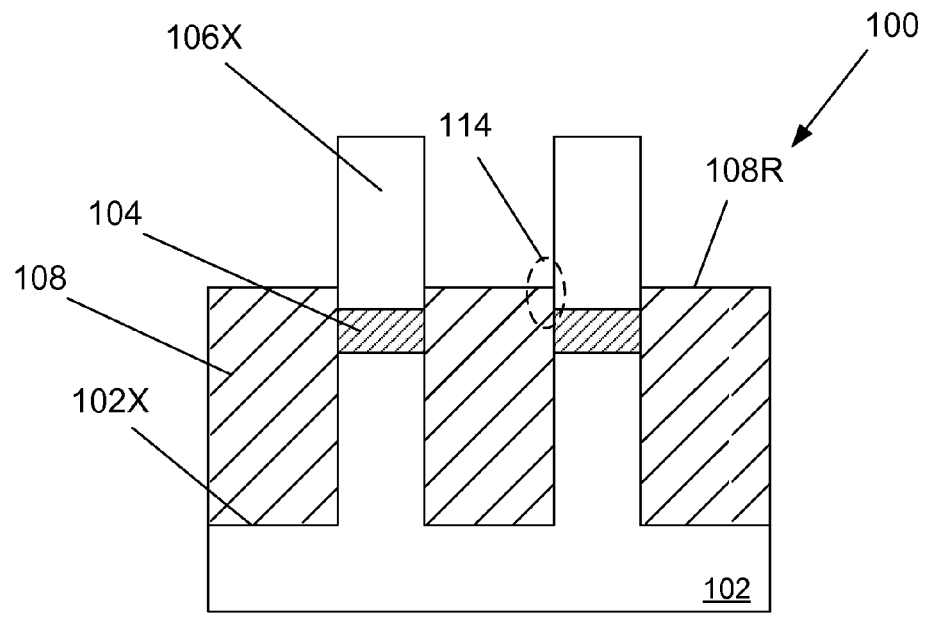

FIG. 3B depicts the device 100 after a first recess etching process was performed to recess the layer of insulating material 108 relative to the surrounding materials. In one embodiment, the recess etching process may be an isotropic etching process. Note that this recess etching process is controlled such that the recessed upper surface 108R of the layer of insulating material still covers a portion of the final fin structures 106X, as indicated in the dashed-line region 114.

Figure 3C:
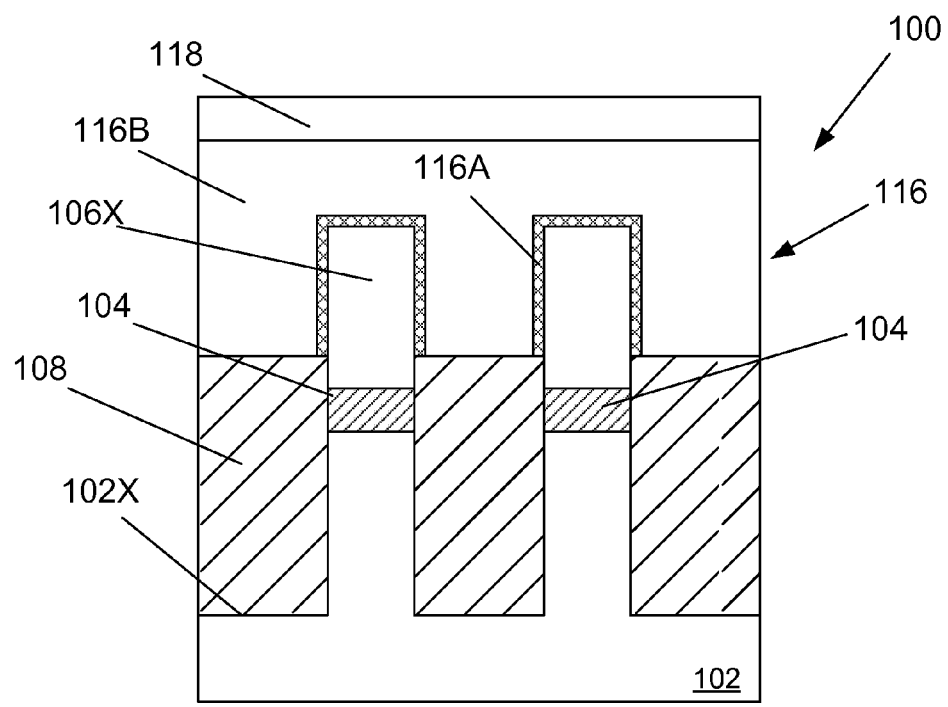

FIG. 3C depicts the device 100 after the above-described sacrificial gate structure 116, gate cap layer 118 and sidewall spacers 125 were formed on the device 100.

Figure 3D:
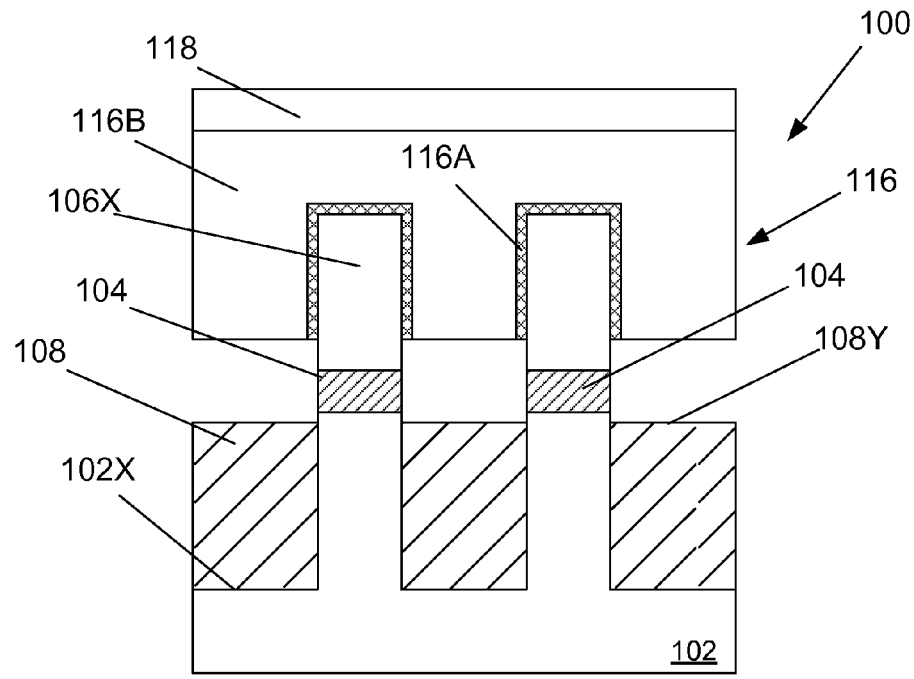

FIG. 3D depicts the device 100 after a second recess etching process was performed to further recess the layer of insulating material 108 relative to the surrounding materials. Note that this recess etching process is controlled such that the recessed upper surface 108Y after the second recess etching process exposes the first epi semiconductor material 104 for further processing.

Figure 3E:
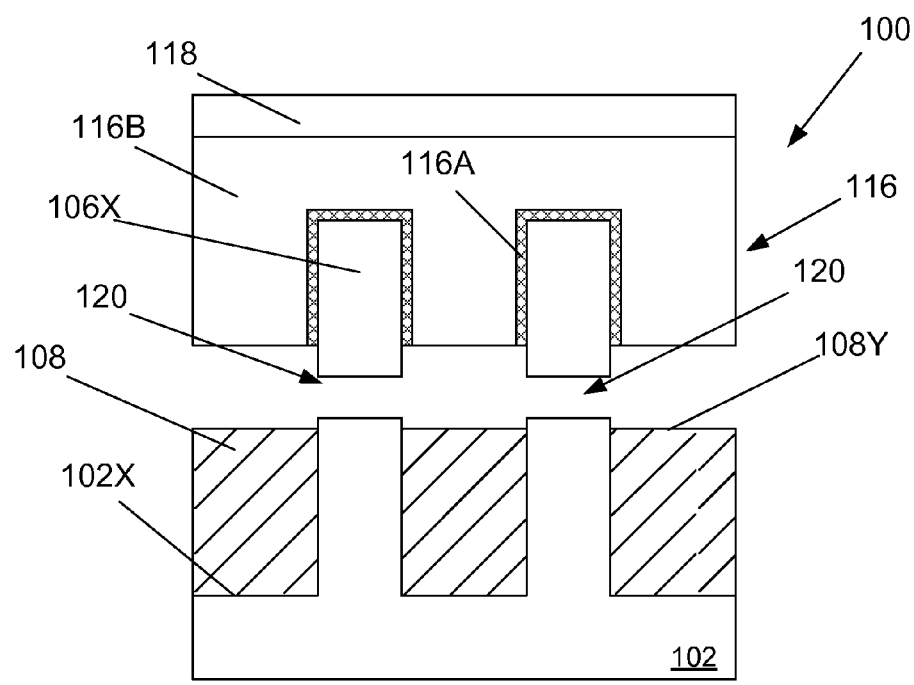

FIG. 3E depicts the device 100 after an isotropic etching process was performed to remove the first epi semiconductor material 104 selectively relative to the final fin structures 106X and the substrate 102. This results in the formation of the above-described under-fin cavity 120 that extends under the entire axial length of each of the final fin structures 106X, i.e., under the channel region of the device and under the final fin structures 106X in the source/drain regions of the device. As before, the interconnected gate structures 116 provide mechanical support to the final fin structures 106X after the under-fin cavity 120 is formed and before it is filled, as described more fully below.

Figure 3F:
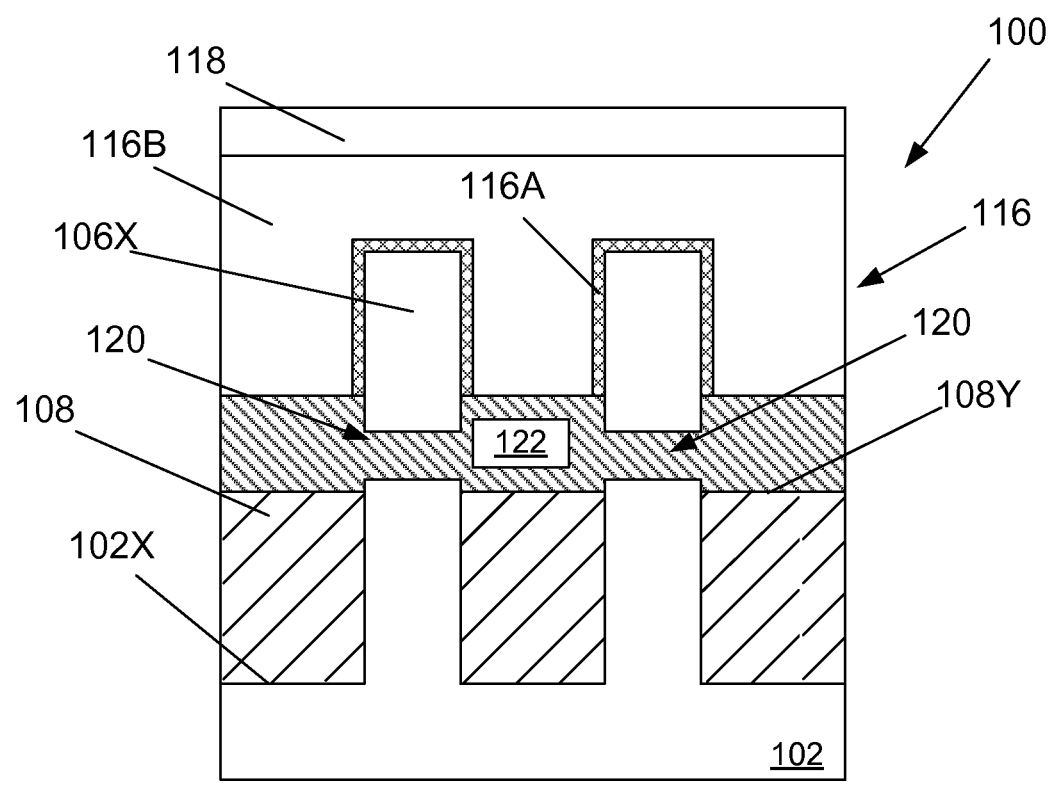

FIG. 3F depicts the device 100 after the under-fin cavity 120 was substantially filled with the above-described stressed material 122. As with the example above, the stressed material 122 is formed under the entire axial length of the final fin structures 106X, under the channel region 130 and generally across what will become the source/drain regions 124 of the device 100.

At this point in the process flow, traditional manufacturing processes may be performed to complete the fabrication of the device, e.g., formation of a replacement gate structure using the methods discussed in the background section of the application, formation of contacts and metallization layers, etc. The methods disclosed herein may be employed in manufacturing integrated circuit products using so-called gate-last (replacement gate) manufacturing techniques. The replacement gate structure typically comprises a high-k (k value greater than 10) gate insulation layer, such as hafnium oxide, one or more metal layers (e.g., layers of titanium nitride or TiAlC depending upon the type of transistor device being manufactured), and a bulk conductive material layer, such as tungsten or aluminum. After the various layers of material that will be present in the replacement gate structure are sequentially deposited in the gate cavity, one or more CMP processes are performed to remove excess portions of the gate materials positioned outside of the gate cavity, as described in the background section of this application.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a FinFET device above structure comprising a semiconductor substrate, a first epi semiconductor material positioned on said semiconductor substrate and a second epi semiconductor material positioned on said first epi semiconductor material, the method comprising:

performing at least one trench etching process to define a plurality of trenches in said semiconductor substrate so as to thereby define an initial fin structure that comprises a portion of said semiconductor substrate, a portion of said first epi semiconductor material and a portion of said second epi semiconductor material, said initial fin structure having an axial length;

forming a layer of insulating material so as to over-fill said trenches;

performing a first recess etching process to recess an upper surface of said layer of insulating material such that a portion, but not all, of said second epi semiconductor material portion of said initial fin structure is exposed, wherein said second epi semiconductor material constitutes a final fin structure of said FinFET device;

forming a gate structure above and around said final fin structure;

after forming said gate structure and with said gate structure remaining in position, performing at least one etching process to remove said first epi semiconductor material of said initial fin structure and thereby define an under-fin cavity under said final fin structure; and substantially filling said under-fin cavity with a stressed material.

2. The method of claim 1, wherein substantially filling said under-fin cavity with said stressed material comprises depositing one of a nitride material, an oxide material or a metal-containing material in said under-fin cavity and above said layer of insulating material.

3. The method of claim 1, wherein said stressed material within said under-fin cavity is formed with one of a tensile stress or a compressive stress.

4. The method of claim 1, wherein said gate structure is a sacrificial gate structure.

5. The method of claim 1, wherein said semiconductor substrate is silicon, said first epi semiconductor material is substantially pure germanium or silicon-germanium ($Si_xGe_{1-x}$) and said second epi semiconductor material is silicon.

6. A method of forming a FinFET device, comprising:

forming a first epi semiconductor material on a semiconductor substrate;

forming a second epi semiconductor material on said first epi semiconductor material;

performing at least one trench etching process to define a plurality of trenches in said semiconductor substrate so as to thereby define an initial fin structure comprised of a portion of said semiconductor substrate, a portion of said first epi semiconductor material and a portion of said second epi semiconductor material, said initial fin structure having an axial length;

forming a layer of insulating material so as to over-fill said trenches;

performing a first recess etching process to recess an upper surface of said layer of insulating material such that a portion, but not all, of said second epi semiconductor material portion of said initial fin structure is exposed, wherein said second epi semiconductor material constitutes a final fin structure of said FinFET device;

forming a gate structure above and around said final fin structure;

after forming said gate structure, performing a second recess etching process to further recess the previously recessed upper surface of said layer of insulating material such that said first epi semiconductor material of said initial fin structure is exposed;

with said gate structure remaining in position, performing at least one etching process to remove said first epi semiconductor material of said initial fin structure and thereby define an under-fin cavity under said final fin structure; and substantially filling said under-fin cavity with a stressed material.

7. The method of claim 6, wherein substantially filling said under-fin cavity with said stressed material comprises depositing one of a nitride material, an oxide material or a metal-containing material in said under-fin cavity and above said layer of insulating material.

8. The method of claim 7, wherein said stressed material within said under-fin cavity is formed with one of a tensile stress or a compressive stress.

9. The method of claim 8, wherein said gate structure is a sacrificial gate structure.

10. The method of claim 7, wherein said semiconductor substrate is silicon, said first epi semiconductor material is substantially pure germanium or silicon-germanium ($Si_xGe_{1-x}$) and said second epi semiconductor material is silicon.

11. A method of forming a FinFET device, comprising:

forming a first epi semiconductor material comprised of substantially pure germanium or silicon-germanium ($Si_xGe_{1-x}$) on a silicon substrate;

forming a second epi silicon semiconductor material on said first epi semiconductor material;

performing at least one trench etching process to define a plurality of trenches in said silicon substrate so as to thereby define an initial fin structure comprised of a portion of said silicon substrate, a portion of said first epi semiconductor material and a portion of said second epi semiconductor material, said initial fin structure having an axial length;

forming a layer of insulating material so as to over-fill said trenches;

performing a first recess etching process to recess an upper surface of said layer of insulating material such that a portion, but not all, of said second epi semiconductor material portion of said initial fin structure is exposed, and wherein said second epi semiconductor material constitutes a final fin structure of said FinFET device;

forming a gate structure above and around said final fin structure;

after forming said gate structure, performing a second recess etching process to further recess the previously recessed upper surface of said layer of insulating material such that said first epi semiconductor material of said initial fin structure is exposed;

with said gate structure remaining in position, performing at least one etching process to remove said first epi semiconductor material of said initial fin structure and thereby define an under-fin cavity under said final fin structure; and substantially filling said under-fin cavity with a stressed material.

12. The method of claim 11, wherein substantially filling said under-fin cavity with said stressed material comprises depositing one of a nitride material, an oxide material or a metal-containing material in said under-fin cavity and above said layer of insulating material.

* * * * *